(12) United States Patent
Chau et al.

(10) Patent No.: US 6,617,210 B1
(45) Date of Patent: Sep. 9, 2003

(54) METHOD FOR MAKING A SEMICONDUCTOR DEVICE HAVING A HIGH-K GATE DIELECTRIC

(75) Inventors: Robert Chau, Beaverton, OR (US); Reza Arghavani, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/159,520

(22) Filed: May 31, 2002

(51) Int. Cl.[7] .......................................... H01L 21/8242
(52) U.S. Cl. ...................... 438/240; 438/287; 438/591; 438/624; 438/763; 438/775; 438/791
(58) Field of Search ................ 438/240, 624, 438/775, 763, 791, 287, 591

(56) References Cited

U.S. PATENT DOCUMENTS

| 5,625,217 | A |   | 4/1997  | Chau et al. ............... 257/412 |
| 5,783,478 | A |   | 7/1998  | Chau et al. ............... 438/592 |
| 5,891,798 | A | * | 4/1999  | Doyle et al. .............. 438/624 |
| 5,949,108 | A | * | 9/1999  | Doyle ...................... 257/347 |
| 6,228,691 | B1 | * | 5/2001 | Doyle ...................... 438/149 |
| 6,306,742 | B1 | * | 10/2001 | Doyle et al. ............. 438/591 |
| 6,511,872 | B1 | * | 1/2003 | Donnelly et al. ......... 438/197 |
| 6,528,856 | B1 | * | 3/2003 | Bai et al. .................. 257/411 |

* cited by examiner

*Primary Examiner*—Caridad Everhart
*Assistant Examiner*—Belur V Keshavan
(74) *Attorney, Agent, or Firm*—Mark V. Seeley

(57) ABSTRACT

A method for making a semiconductor device is described. That method comprises forming on a substrate a dielectric layer that has a dielectric constant that is greater than the dielectric constant of silicon dioxide. An insulating layer, which is compatible with the dielectric layer and a gate electrode to be formed on the insulating layer, is formed on the dielectric layer, and a gate electrode is then formed on the insulating layer.

10 Claims, 1 Drawing Sheet

METHOD FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin gate dielectrics made from silicon dioxide may experience unacceptable gate leakage currents. Forming the gate dielectric from certain high-k dielectric materials, in place of silicon dioxide, can reduce gate leakage. Such a dielectric may not, however, be compatible with polysilicon—the preferred material for making the device's gate electrode. Placing a thin layer of titanium nitride, which is compatible with many high-k gate dielectrics, between a high-k gate dielectric and a polysilicon-based gate electrode may enable such a dielectric to be used with such a gate electrode. Unfortunately, for devices built on certain types of substrates, the presence of such a layer may increase the transistor's threshold voltage, which is undesirable.

Accordingly, there is a need for an improved process for making a semiconductor device that includes a high-k gate dielectric. There is a need for such a process in which a polysilicon-based gate electrode is formed on such a gate dielectric to create a functional device—without causing undesirable work function shifts. The method of the present invention provides such a process.

DETAILED DESCRIPTION OF THE PRESENT INVENTION

A method for making a semiconductor device is described. That method comprises forming on a substrate a dielectric layer that has a dielectric constant that is greater than the dielectric constant of silicon dioxide. An insulating layer is formed on the dielectric layer, the insulating layer being compatible with the dielectric layer and a gate electrode to be formed on the insulating layer. A gate electrode is then formed on the insulating layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
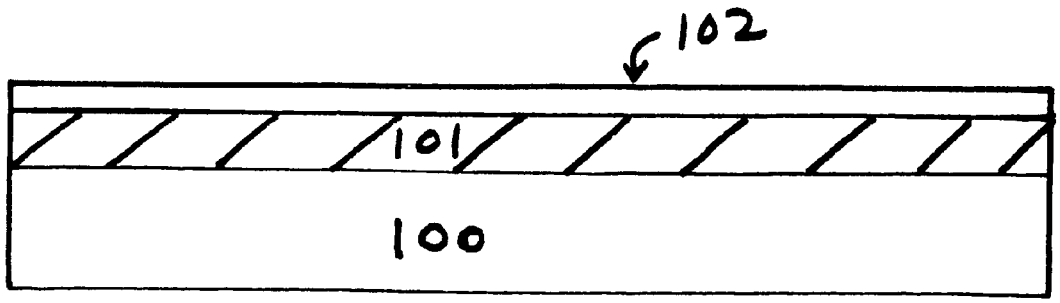
FIGS. 1a–1c represent cross-sections of structures that may be formed when carrying out an embodiment of the method of the present invention.
Figure 1B:
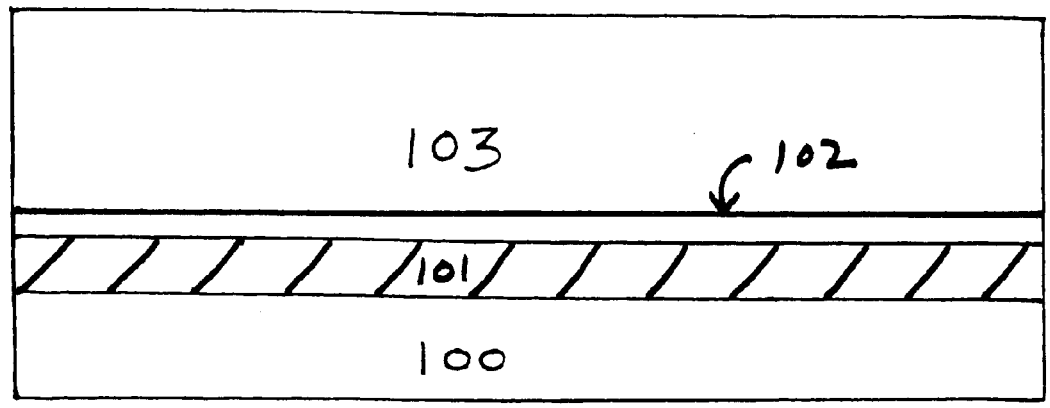
Figure 1C:
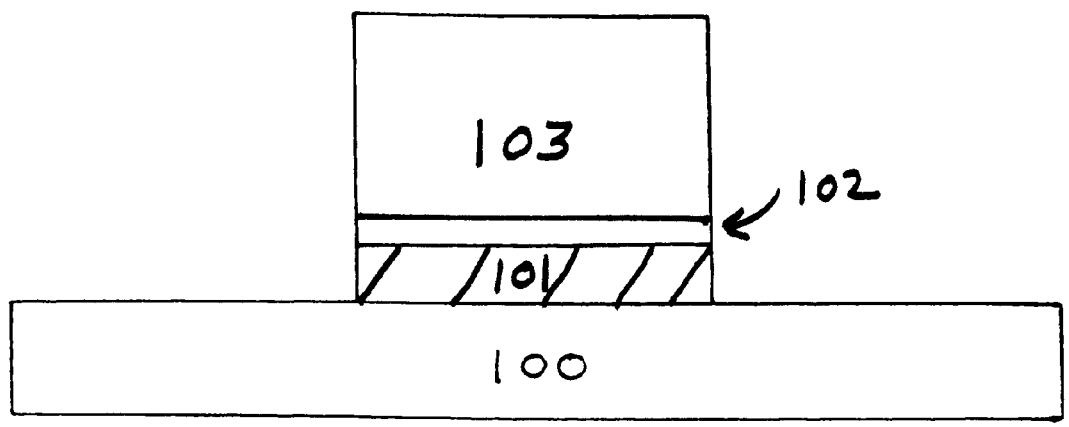

In an embodiment of the method of the present invention, as illustrated by FIGS. 1a–1c, dielectric layer 101 is formed on substrate 100. Substrate 100 may include isolation regions, p-type wells and n-type wells that have been formed in a bulk silicon or silicon-on-insulator substructure. Substrate 100 may comprise other materials—which may or may not be combined with silicon—such as: germanium, indium antimonide, lead telluride, indium arsenide, indium phosphide, gallium arsenide, or gallium antimonide. Although several examples of materials from which substrate 100 may be formed are described here, any material that may serve as a foundation upon which a semiconductor device may be built falls within the spirit and scope of the present invention.

Dielectric layer 101 comprises a material that has a dielectric constant that is greater than the dielectric constant of silicon dioxide. Dielectric layer 101 preferably has a dielectric constant that is at least about twice that of silicon dioxide, i.e., a dielectric constant that is greater than about 8. When serving as the gate dielectric for the semiconductor device, dielectric layer 101 is a "high-k gate dielectric." Some of the materials that may be used to make high-k gate dielectrics include: hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide, and aluminum oxide. Although a few examples of materials that may be used to form dielectric layer 101 are described here, that layer may be made from other materials that serve to reduce gate leakage from the level present in devices that include silicon dioxide gate dielectrics.

Dielectric layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 101. The CVD reactor should be operated long enough to form a layer with the desired thickness. In most applications, dielectric layer 101 should be less than about 100 angstroms thick, and more preferably between about 5 angstroms and about 60 angstroms thick.

As deposited, dielectric layer 101 may include undesirable impurities, e.g., hydrogen and/or unreacted metal, which render that layer incompatible with polysilicon. In the method of the present invention, insulating layer 102 is formed on dielectric layer 101. Insulating layer 102 will be compatible with dielectric layer 101 and a gate electrode to be formed on the insulating layer. Insulating layer 102 may comprise a single layer or multiple layers.

Insulating layer 102 may be made from silicon nitride. Such a silicon nitride layer may be formed on dielectric layer 101 using conventional silicon nitride deposition techniques, e.g., conventional CVD, PVD or remote plasma processes. In a preferred embodiment, such a process is used to form a silicon nitride layer that is between about 3 angstroms and about 25 angstroms thick. Such a silicon nitride insulating layer may consist essentially of a single silicon nitride layer, or alternatively consist essentially of a plurality of monolayers of silicon nitride.

Although silicon nitride is a preferred material for forming insulating layer 102, other materials that are compatible with both dielectric layer 101 and polysilicon, and that prevent polysilicon from interacting with dielectric layer 101, may be used instead—without departing from the spirit and scope of the present invention. Substrate 100 may comprise a thin silicon-on-insulator substructure, e.g., one that is sufficiently thin to facilitate the subsequent formation of a fully depleted device. Devices built upon such a substrate may be less susceptible to work function shifts that may result, when forming a thin metallic nitride layer between a high-k gate dielectric and a polysilicon-based gate electrode. For that reason, when substrate 100 comprises a thin silicon-on-insulator substructure, insulating layer 102 may comprise a metallic nitride, for example, titanium nitride or tantalum nitride.

After insulating layer 102 is formed on dielectric layer 101, a gate electrode may be formed on insulating layer 102. In a preferred embodiment, the gate electrode may be formed by initially depositing polysilicon layer 103 on insulating layer 102—generating the FIG. 1b structure. Polysilicon layer 103 may be deposited using conventional methods and preferably is between about 2,000 angstroms and about 4,000 angstroms thick. Layers 103, 102 and 101 are then etched, using conventional techniques, to form the FIG. 1c structure. Additional steps, which are generally used to complete the gate electrode (e.g., forming a suicide (not shown) on the upper part of etched polysilicon structure 103), may follow. As such steps are well known to those skilled in the art, they will not be described in more detail here.

Forming an insulating layer between a high-k dielectric and polysilicon-based gate electrode may enable such a high-k gate dielectric to be used with such a polysilicon-based gate electrode. Although the embodiments described above are examples of processes for forming semiconductor devices that include a high-k gate dielectric layer and a polysilicon gate electrode, the present invention is not limited to these particular embodiments. The method of the present invention contemplates any process that employs an intermediary insulating layer to enable otherwise incompatible dielectric layers and gate electrodes to be used together.

Features shown in the above referenced drawings are not intended to be drawn to scale, nor are they intended to be shown in precise positional relationship. Additional steps that may be included in the above described method have been omitted as they are not useful to describe aspects of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
   forming a high-k gate dielectric layer on a substrate;
   forming an insulating layer on the high-k gate dielectric layer that is compatible with the high-k gate dielectric layer and a gate electrode to be formed on the insulating layer; and
   forming a layer that comprises polysilicon on the insulating layer;
   wherein the insulating layer comprises silicon nitride or a metallic nitride; the substrate comprises silicon; and the high-k gate dielectric layer Is formed by atomic layer chemical vapor deposition, and is between about 5 angstroms and about 60 angstroms thick.

2. The method of claim 1 wherein the high-k gate dielectric layer comprises a material selected from the group consisting of hafnium oxide, zirconium oxide, titanium oxide, and aluminum oxide.

3. The method of claim 2 wherein the insulating layer is between about 3 angstroms and about 25 angstroms thick.

4. The method of claim 2 wherein the insulating layer consists essentially of a single silicon nitride layer.

5. The method of claim 3 wherein the insulating layer consists essentially of a plurality of monolayers of silicon nitride.

6. The method of claim 3 wherein the substrate comprises a silicon-on-insulator substructure and the insulating layer comprises a metallic nitride.

7. A method for making a semiconductor device comprising:
   forming a high-k gate dielectric layer on a substrate, the high-k gate dielectric layer being less than about 100 angstroms thick and comprising a material selected from the group consisting of hafnium oxide, zirconium oxide, titanium oxide, and aluminum oxide;
   forming on the high-k gate dielectric layer an insulating layer that comprises silicon nitride or a metallic nitride and that is between about 3 angstroms and about 25 angstroms thick;
   forming a layer that comprises polysilicon on the insulating layer; and
   etching the polysilicon containing layer, the insulating layer, and the high-k gate dielectric layer.

8. The method of claim 7 wherein the high-k gate dielectric layer is formed by atomic layer chemical vapor deposition and is between about 5 angstroms and about 60 angstroms thick.

9. The method of claim 8 wherein the insulating layer consists essentially of a single silicon nitride layer.

10. The method of claim 8 wherein the insulating layer consists essentially of a plurality of monolayers of silicon nitride.

* * * * *